US010803931B2

(12) United States Patent
Chien

(10) Patent No.: US 10,803,931 B2
(45) Date of Patent: Oct. 13, 2020

(54) NON-VOLATILE MEMORY HAVING MEMORY ARRAY WITH DIFFERENTIAL CELLS

(71) Applicant: eMemory Technology Inc., Hsin-Chu (TW)

(72) Inventor: Yu-Shan Chien, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 0 days.

(21) Appl. No.: 16/581,838

(22) Filed: Sep. 25, 2019

(65) Prior Publication Data
US 2020/0160907 A1 May 21, 2020

Related U.S. Application Data

(60) Provisional application No. 62/768,099, filed on Nov. 16, 2018.

(51) Int. Cl.
G11C 16/06 (2006.01)
G11C 11/56 (2006.01)
G11C 5/14 (2006.01)
G11C 16/30 (2006.01)
G11C 16/24 (2006.01)
G11C 16/28 (2006.01)
G11C 16/08 (2006.01)
G11C 16/04 (2006.01)
G11C 16/10 (2006.01)
G11C 16/26 (2006.01)
G11C 16/34 (2006.01)
G05F 3/30 (2006.01)
G05F 3/22 (2006.01)
G11C 16/14 (2006.01)
(Continued)

(52) U.S. Cl.
CPC ........... G11C 11/5642 (2013.01); G05F 3/22 (2013.01); G05F 3/30 (2013.01); G11C 5/147 (2013.01); G11C 16/0408 (2013.01); G11C 16/0433 (2013.01); G11C 16/08 (2013.01); G11C 16/10 (2013.01); G11C 16/14 (2013.01); G11C 16/24 (2013.01); G11C 16/26 (2013.01); G11C 16/28 (2013.01); G11C 16/30 (2013.01); G11C 16/3445 (2013.01); G11C 16/3459 (2013.01); H01L 27/0207 (2013.01); H01L 27/11524 (2013.01)

(58) Field of Classification Search
CPC ..................................................... G11C 16/26
USPC ................................................... 365/185.21
See application file for complete search history.

(56) References Cited

U.S. PATENT DOCUMENTS 10,090,027 B2   10/2018  Wu
2006/0034142 A1* 2/2006  Ooishi ..................... G11C 8/10
                                                    365/230.06

* cited by examiner

Primary Examiner — Hoai V Ho
(74) Attorney, Agent, or Firm — WPAT, PC

(57) ABSTRACT

A non-volatile memory includes a memory array, a selecting circuit, a reference current generator and a sensing circuit. The memory array includes a top main array, a top corresponding array, a bottom main array and a bottom corresponding array. The top main array includes plural top bit lines. The top corresponding array includes plural inverted top bit lines. The bottom main array includes plural bottom bit lines. The bottom corresponding array includes plural inverted bottom bit lines. The selecting circuit is connected with the top main array, the top corresponding array, the bottom main array and the bottom corresponding array. The reference current generator and the sensing circuit are connected with the selecting circuit.

19 Claims, 11 Drawing Sheets

(51) Int. Cl.
*H01L 27/02* (2006.01)
*H01L 27/11524* (2017.01)

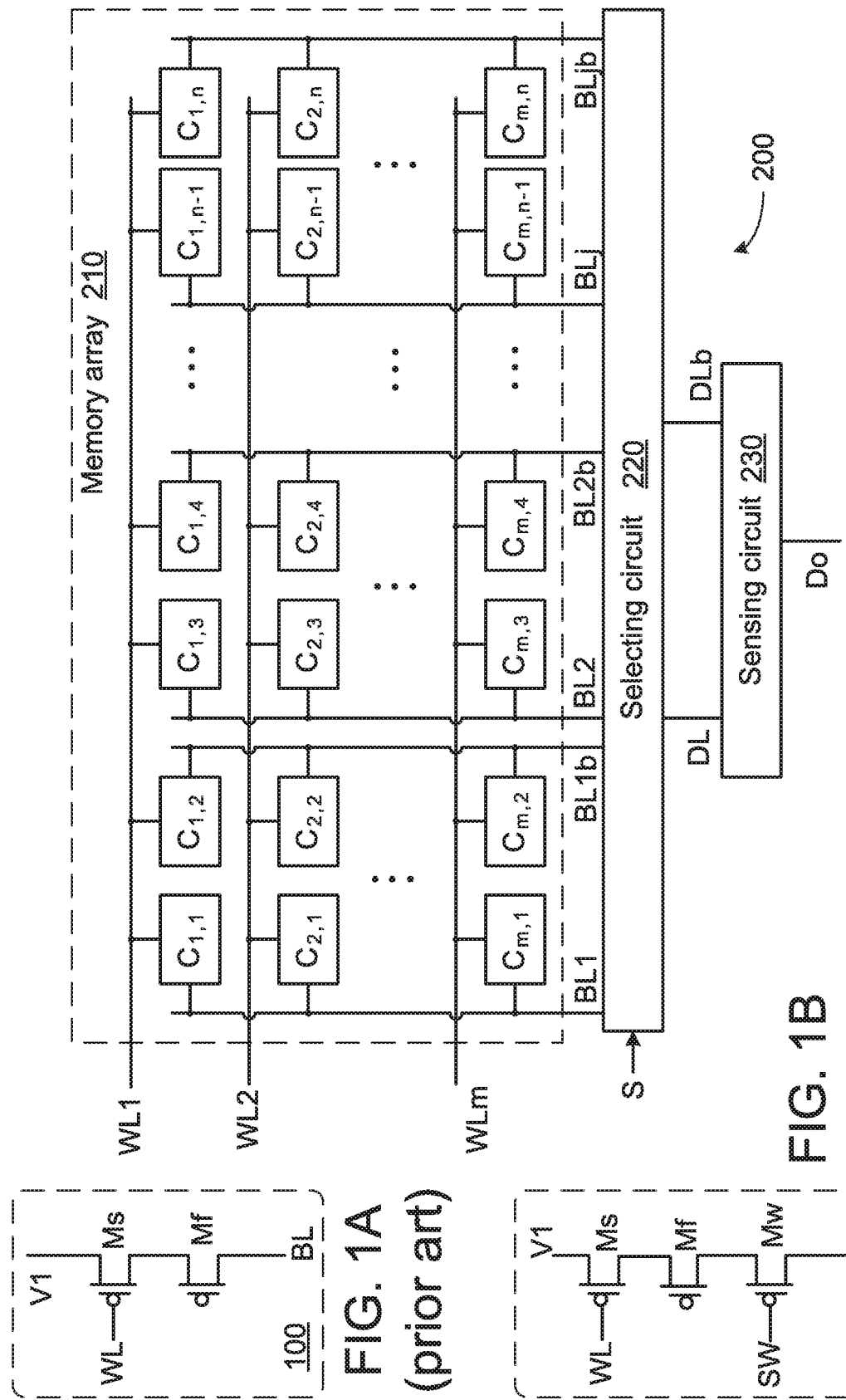

NON-VOLATILE MEMORY HAVING MEMORY ARRAY WITH DIFFERENTIAL CELLS

This application claims the benefit of U.S. provisional application Ser. No. 62/768,099, filed Nov. 16, 2018, the subject matter of which is incorporated herein by reference.

FIELD OF THE INVENTION

The present invention relates to a non-volatile memory, and more particularly to a non-volatile memory having a memory array with differential cells.

BACKGROUND OF THE INVENTION

FIGS. 1A and 1B are schematic circuit diagrams illustrating two conventional cells.

Please refer to FIG. 1A. The cell 100 comprises a select transistor Ms and a floating gate transistor Mf. The select transistor Ms and the floating gate transistor Mf are p-type transistors.

The gate terminal of the select transistor Ms is connected with a word line WL. A first terminal of the select transistor Ms receives a power voltage V1. A second terminal of the select transistor Ms is connected with a first terminal of the floating gate transistor Mf. A second terminal of the floating gate transistor Mf is connected with a bit line BL.

During a program cycle, the proper power voltage V1 is provided to the select transistor Ms and the proper bias voltage is provided to the bit line BL. Consequently, the cell 100 is in a first state or a second state. For example, when the word line WL is activated, the gate terminal of the select transistor Ms receives an on voltage. Consequently, the select transistor Ms is turned on.

In case that the voltage difference between the power voltage V1 and the bit line BL is large and a program current is generated, carriers are injected into the floating gate of the floating gate transistor Mf. Consequently, the state of the cell 100 is changed from the first state to the second state. In case that the voltage difference between the power voltage V1 and the bit line BL is insufficient to generate the program current, no carriers are injected into the floating gate of the floating gate transistor Mf. Consequently, the cell 100 is maintained in the first state.

During an erase cycle, the proper power voltage V1 is provided to the select transistor Ms and the proper bias voltage is provided to the bit line BL. Since the carriers are ejected from the floating gate of the floating gate transistor Mf, the cell 100 is restored to the first state.

During a read cycle, the proper power voltage V1 is provided to the select transistor Ms and the proper bias voltage is provided to the bit line BL. When the word line WL is activated, a read current is generated between the power voltage V1 and the bit line BL. If the states of the cell 100 are different, the magnitudes of the read current are different. According to the magnitude of the read current, the cell 100 is determined to be in the first state or the second state.

For example, the cell 100 in the first state generates the read current I1, and the cell 100 in the second state generates the read current I2. Moreover, a reference current Iref in the range between the read current I1 and the read current I2 is defined. For example, I1<Iref<I2. If the read current generated by the cell 100 is lower than the reference current Iref, it is determined that the cell 100 is in the first state. Whereas, if the read current generated by the cell 100 is higher than the reference current Iref, it is determined that the cell 100 is in the second state.

Please refer to FIG. 1B. The cell 120 comprises a select transistor Ms, a floating gate transistor Mf and a switch transistor Mw. The select transistor Ms, the floating gate transistor Mf and the switch transistor Mw are p-type transistors.

The gate terminal of the select transistor Ms is connected with a word line WL. A first terminal of the select transistor Ms receives a power voltage V1. A second terminal of the select transistor Ms is connected with a first terminal of the floating gate transistor Mf. A second terminal of the floating gate transistor Mf is connected with a first terminal of the switch transistor Mw. A second terminal of the switch transistor Mw is connected with a bit line BL. The gate terminal of the switch transistor Mw is connected with a control line SW.

When the word line WL and the control line SW are activated, the gate terminal of the select transistor Ms and the switch transistor Mw receive an on voltage. Consequently, the select transistor Ms and the switch transistor Mw are turned on. During a program cycle, the proper power voltage V1 is provided to the select transistor Ms and the proper bias voltage is provided to the bit line BL. Consequently, the cell 120 is in a first state or a second state. Similarly, the storage state is determined during the read cycle. Similarly, the cell 120 is restored to the first state during an erase cycle.

FIG. 2 is a schematic circuit diagram illustrating a conventional non-volatile memory. The non-volatile memory 200 comprises a memory array 210, a selecting circuit 220 and a sensing circuit 230. The memory array 210 comprises plural cells $C_{1,1}$~$C_{m,n}$ which are arranged in an m×n array. Each cell has the structure of the cell as shown in FIG. 1A or 1B. It is noted that the structure of the cell is not restricted. For example, the cell may be composed of n-type transistors.

Moreover, n cells in each row of the memory array 210 are formed as n/2 differential cells, wherein n is an even value. Take the n cells $C_{1,1}$~$C_{1,n}$ in the first row of the memory array 210. These n cells are connected with the word line WL1. The odd-numbered cells $C_{1,1}$ and $C_{1,3}$~$C_{1,n-1}$ are main cells. The even-numbered cells $C_{1,2}$ and $C_{1,4}$~$C_{1,n}$ are corresponding cells. Moreover, each differential cell contains a main cell and a corresponding cell.

The first differential cell of the memory array 210 contains a main cell $C_{1,1}$ and a corresponding cell $C_{1,2}$. The main cell $C_{1,1}$ is connected with the bit line BL1. The corresponding cell $C_{1,2}$ is connected with the inverted bit line BL1b. The second differential cell of the memory array 210 contains a main cell $C_{1,3}$ and a corresponding cell $C_{1,4}$. The main cell $C_{1,3}$ is connected with the bit line BL2. The corresponding cell $C_{1,4}$ is connected with the inverted bit line BL2b. The rest may be deduced by analogy. The (n/2)-th differential cell of the memory array 210 contains a main cell $C_{1,n-1}$ and a corresponding cell $C_{1,n}$. The main cell $C_{1,n-1}$ is connected with the bit line BLj. The corresponding cell $C_{1,n}$ is connected with the inverted bit line BLjb, wherein j=n/2. The relationships between the cells in other rows of the memory array 210 and associated signal lines are similarly between the relationships between the cells in the first row of the memory array 210 and associated signal lines, and are not redundantly described herein.

During the program cycle, the two cells of each differential cell are programmed to different storage states. For example, if the main cell is programmed to the first state, the corresponding cell is programmed to the second state.

Whereas, if the main cell is programmed to the second state, the corresponding cell is programmed to the first state.

The n input terminals of the selecting circuit 220 are connected with all bit lines BL1~BLj and all inverted bit lines BL1b~BLjb. According to a select signal S, the bit line and the inverted bit line at the corresponding input terminals of the selecting circuit 220 are connected with the data line DL and the inverted data line DLb at the output terminal of the selecting circuit 220. For example, if the select signal S is "2", the selecting circuit 220 connects the bit line BL2 and the inverted BL2b with the data line DL and the inverted data line DLb, respectively. Whereas, if the select signal S is "j", the selecting circuit 220 connects the bit line BLj and the inverted BLjb with the data line DL and the inverted data line DLb, respectively.

The sensing circuit 230 is connected with the data line DL and the inverted data line DLb. According to the difference between the two read currents flowing through the data line DL and the inverted data line DLb, the sensing circuit 230 generates an output signal Do. The storage state of the selected differential cell is determined according to the output signal Do.

That is, during the read cycle, the sensing circuit 230 determines the storage state of the selected differential cell according to the two read currents flowing through two bit lines of the selected differential cell. For example, if the read current flowing through the data line DL is higher than the read current flowing through the inverted data line DLb, the output signal Do from the sensing circuit 230 has a logic value "1". Meanwhile, the selected differential cell is in the first storage state. Whereas, if the read current flowing through the data line DL is lower than the read current flowing through the inverted data line DLb, the output signal Do from the sensing circuit 230 has a logic value "0". Meanwhile, the selected differential cell is in the second storage state.

However, as the number of cells in the memory array 210 increases, the size of the memory array 210 increases and the power consumption of the non-volatile memory 200 increases. For example, as the size of the memory array 210 increases, the number of cells connected with each bit line increases and the length of the bit line needs to be extended. Consequently, during the read cycle, the read current generated by the selected cell of the memory array 210 needs to charge the parasitic capacitances of other cells in the same bit line.

Since the charging path of bit line becomes longer and the read current is not larger, the charging speed is not fast enough and the reading speed decreases. As known, if the read voltage applied to the memory array 210 is increased, the read current of the cell is increased and the above drawbacks are overcome. However, as the read voltage is increased, the power consumption of the non-volatile memory 200 is increased. Under this circumstance, the non-volatile memory 200 cannot be applied to the electronic component that requires low power consumption.

SUMMARY OF THE INVENTION

An embodiment of the present invention provides a non-volatile memory. The non-volatile memory includes a memory array, a selecting circuit, a reference current generator and a sensing circuit. The memory array includes a top main array, a top corresponding array, a bottom main array and a bottom corresponding array. The top main array includes j top bit lines. The top corresponding array includes j inverted top bit lines. The bottom main array includes j bottom bit lines. The bottom corresponding array includes j inverted bottom bit lines. The selecting circuit includes a first front selector, a second front selector, a third front selector, a fourth front selector, a fifth front selector, a first medium selector, a second medium selector, a third medium selector, a fourth medium selector, a first rear selector and a second rear selector. The reference current generator is connected with the fifth front selector. The reference current generator generates a reference current. The reference current is transmitted from the reference current generator to one of a first current path, a second current path, a third current path and a fourth current path through the fifth front selector. The sensing circuit is connected with a sense line and an inverted sense line. The first front selector is connected with the j top bit lines, and one of the j top bit lines is connected with a top data line through the first front selector. The second front selector is connected with the j inverted top bit lines, and one of the j inverted top bit lines is connected with an inverted top data line through the second front selector. The third front selector is connected with the j bottom bit lines, and one of the j bottom bit lines is connected with a bottom data line through the third front selector. The fourth front selector is connected with the j inverted bottom bit lines, and one of the j inverted bottom bit lines is connected with an inverted bottom data line through the fourth front selector. Two input terminals of the first medium selector are respectively connected with the top data line and the first current path, and an output terminal of the first medium selector is connected with a top select line. Two input terminals of the second medium selector are respectively connected with the inverted top data line and the second current path, and an output terminal of the second medium selector is connected with an inverted top select line. Two input terminals of the third medium selector are respectively connected with the bottom data line and the third current path, and an output terminal of the third medium selector is connected with a bottom select line. Two input terminals of the fourth medium selector are respectively connected with the inverted bottom data line and the fourth current path, and an output terminal of the fourth medium selector is connected with an inverted bottom select line. The first rear selector is connected with the top select line and the bottom select line, and one of the top select line and the bottom select line is connected with the sense line through the first rear selector. The second rear selector is connected with the inverted top select line and the inverted bottom select line, and one of the inverted top select line and the inverted bottom select line is connected with the inverted sense line through the second rear selector.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic circuit diagram illustrating a conventional cell;

FIG. 1B (prior art) is a schematic circuit diagram illustrating another conventional cell;

FIG. 2 (prior art) is a schematic circuit diagram illustrating a conventional non-volatile memory;

DETAILED DESCRIPTION OF PREFERRED EMBODIMENTS

Figure 3:
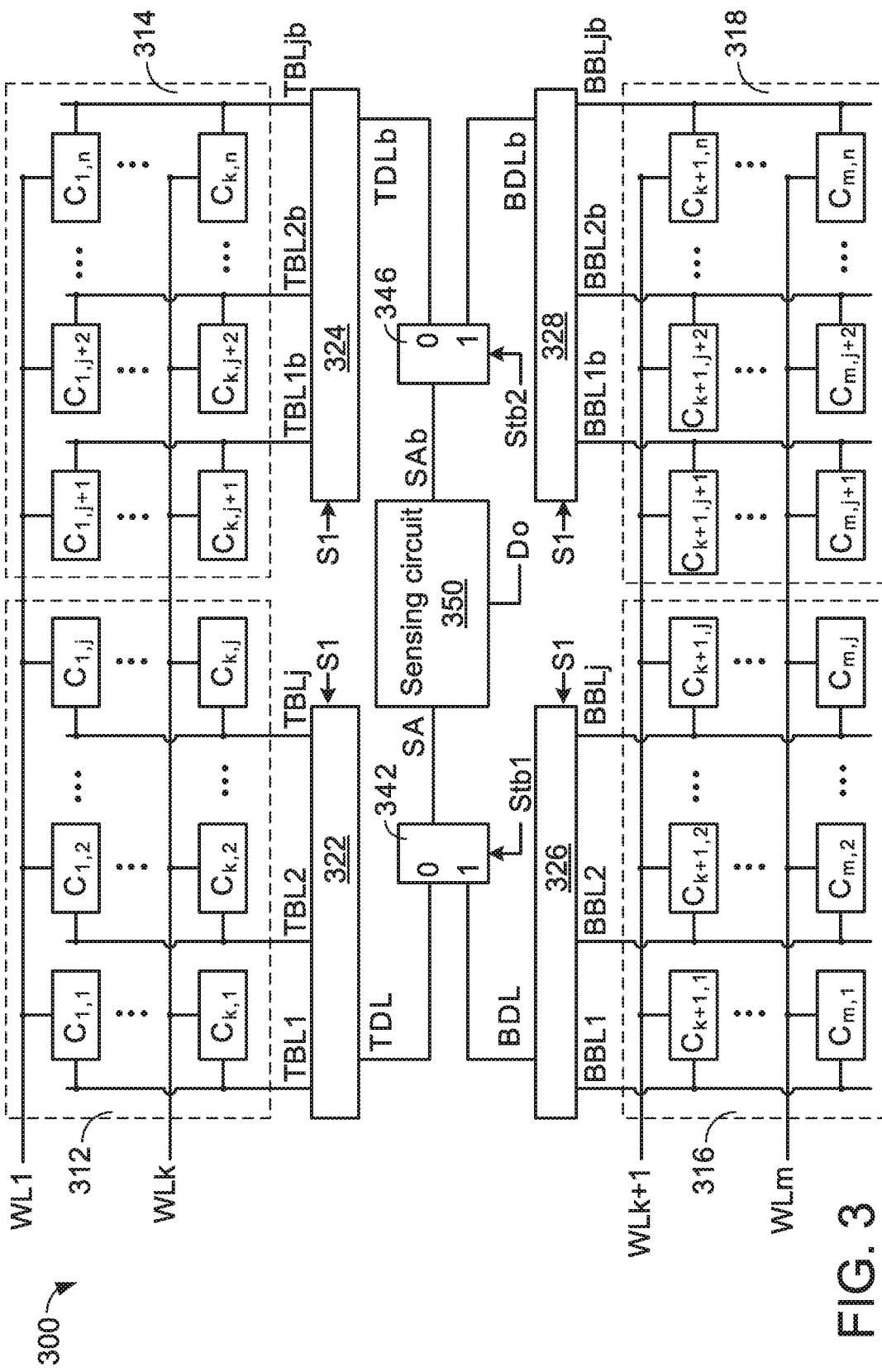
FIG. 3 is a schematic circuit diagram illustrating a non-volatile memory according to a first embodiment of the present invention.

FIG. 3 is a schematic circuit diagram illustrating a non-volatile memory according to a first embodiment of the present invention. As shown in FIG. 3, the non-volatile memory 300 comprises a memory array, a selecting circuit and a sensing circuit 350. The memory array comprises plural cells $C_{1,1} \sim C_{m,n}$ which are arranged in an m×n array.

In this embodiment, the memory array is divided into four sub-arrays. Each sub-array comprises plural cells, which are arranged in a k×j array, wherein k=m/2 and j=n/2. The memory array comprises a top main array 312, a top corresponding array 314, a bottom main array 316 and a bottom corresponding array 318.

The top main array 312 comprises cells $C_{1,1} \sim C_{k,j}$. The top corresponding array 314 comprises cells $C_{1,j+1} \sim C_{k,n}$. Both of the top main array 312 and the top corresponding array 314 are connected with the word lines WL1~WLk. The bottom main array 316 comprises cells $C_{k+1,1} \sim C_{m,j}$. The bottom corresponding array 318 comprises cells $C_{k+1,j+1} \sim C_{m,n}$. Both of the bottom main array 316 and the bottom corresponding array 318 are connected with the word lines WLk+1~WLm.

Moreover, n cells in each row of the memory array are connected with the same word line and formed as n/2 differential cells, wherein n is an even value. Take the n cells in the first row of the memory array. These n cells are connected with the word line WL1. These n cells include the cells $C_{1,1} \sim C_{k,j}$ of the top main array 312 and the cells $C_{1,j+1} \sim C_{k,n}$ of the top corresponding array 314. The cells $C_{1,1} \sim C_{k,j}$ of the top main array 312 are main cells. The cells $C_{1,j+1} \sim C_{k,n}$ of the top corresponding array 314 are corresponding cells.

Moreover, one main cell of the top main array 312 and one corresponding cell of the top corresponding array 314 at the same position are collaboratively formed as a differential cell. In the n cells connected with the word line WL1, the first differential cell contains the main cell $C_{1,1}$ and the corresponding cell $C_{1,j+1}$. The main cell $C_{1,1}$ is connected with the top bit line TBL1. The corresponding cell $C_{1,j+1}$ is connected with the inverted top bit line TBL1b. The second differential cell contains the main cell $C_{1,2}$ and the corresponding cell $C_{1,j+2}$. The main cell $C_{1,2}$ is connected with the top bit line TBL2. The corresponding cell $C_{1,j+2}$ is connected with the inverted top bit line TBL2b. The rest may be deduced by analogy. The (n/2)-th differential cell contains the main cell $C_{1,j}$ and the corresponding cell $C_{1,n}$. The main cell $C_{1,j}$ is connected with the top bit line TBLj. The corresponding cell $C_{1,n}$ is connected with the inverted top bit line TBLjb. The relationships between the cells of the top main array 312 and the top corresponding array 314 and other word lines are similarly between the relationships between the cells of the top main array 312 and the top corresponding array 314 and the word line WL1, and are not redundantly described herein.

Moreover, one main cell of the bottom main array 316 and one corresponding cell of the bottom corresponding array 318 at the same position are collaboratively formed as a differential cell. In the n cells connected with the word line WLk+1, the first differential cell contains the main cell $C_{k+1,1}$ and the corresponding cell $C_{k+1,j+1}$. The main cell $C_{k+1,1}$ is connected with the bottom bit line BBL1. The corresponding cell $C_{k+1,j+1}$ is connected with the inverted bottom bit line BBL1b. The second differential cell contains the main cell $C_{k+1,2}$ and the corresponding cell $C_{k+1,j+2}$. The main cell $C_{k+1,2}$ is connected with the bottom bit line BBL2. The corresponding cell $C_{k+1,j+2}$ is connected with the inverted bottom bit line BBL2b. The rest may be deduced by analogy. The (n/2)-th differential cell contains the main cell $C_{k+1,j}$ and the corresponding cell $C_{k+1,n}$. The main cell $C_{k+1,j}$ is connected with the bottom bit line BBLj. The corresponding cell $C_{k+1,n}$ is connected with the inverted bottom bit line BBLjb. The relationships between the cells of the bottom main array 316 and the bottom corresponding array 318 and other word lines are similarly between the relationships between the cells of the bottom main array 316 and the bottom corresponding array 318 and the word line WLk+1, and are not redundantly described herein.

The selecting circuit comprises four front selectors 322, 324, 326, 328 and two rear selectors 342, 346. The two read currents generated by each differential cell of the memory array can be transmitted to the sensing circuit 350 through the sensing circuit.

Please refer to FIG. 3 again. The j input terminals of the first front selector 322 are connected with the top bit lines TBL1~TBLj. The output terminal of the first front selector 322 is connected with a top data line TDL. According to a select signal S1, the first front selector 322 connects one of the top bit lines TBL1~TBLj with the top data line TDL. The j input terminals of the second front selector 324 are connected with the inverted top bit lines TBL1b~TBLjb. The output terminal of the second front selector 324 is connected with an inverted top data line TDLb. According to the select signal S1, the second front selector 324 connects one of the inverted top bit lines TBL1b~TBLjb with the inverted top data line TDLb. The j input terminals of the third front selector 326 are connected with the bottom bit lines BBL1~BBLj. The output terminal of the third front selector 326 is connected with a bottom data line BDL. According to a select signal S1, the third front selector 326 connects one of the bottom bit lines BBL1~BBLj with the bottom data line BDL. The j input terminals of the fourth front selector 328 are connected with the inverted bottom bit lines BBL1b~BBLjb. The output terminal of the fourth front selector 328 is connected with an inverted bottom data line BDLb. According to the select signal S1, the fourth front selector 328 connects one of the inverted bottom bit lines BBL1b~BBLjb with the inverted bottom data line BDLb.

The two input terminals of the first rear selector 342 are connected with the top data line TDL and the bottom data line BDL, respectively. The output terminal of the first rear selector 342 is connected with a sense line SA. According to a select signal Stb1, the first rear selector 342 connects one of the top data line TDL and the bottom data line BDL with the sense line SA. The two input terminals of the second rear selector 346 are connected with the inverted top data line TDLb and the inverted bottom data line BDLb, respectively. The output terminal of the second rear selector 346 is connected with an inverted sense line SAb. According to a select signal Stb2, the second rear selector 346 connects one of the inverted top data line TDLb and the inverted bottom data line BDLb with the inverted sense line SAb.

The sensing circuit 350 is connected with the sense line SA and the inverted sense line SAb. According to the two read currents flowing through the sense line SA and the inverted sense line SAb, the sensing circuit 350 generates an output signal Do. Moreover, the storage state of the selected differential cell is determined according to the output signal Do. For example, if the read current flowing through the sense line SA is higher than the read current flowing through the inverted sense line SAb, the output signal Do from the sensing circuit 350 has a logic value "1". Meanwhile, the selected differential cell is in the first storage state. Whereas, if the read current flowing through the sense line SA is lower than the read current flowing through the inverted sense line SAb, the output signal Do from the sensing circuit 350 has a logic value "0". Meanwhile, the selected differential cell is in the second storage state.

Figure 4:
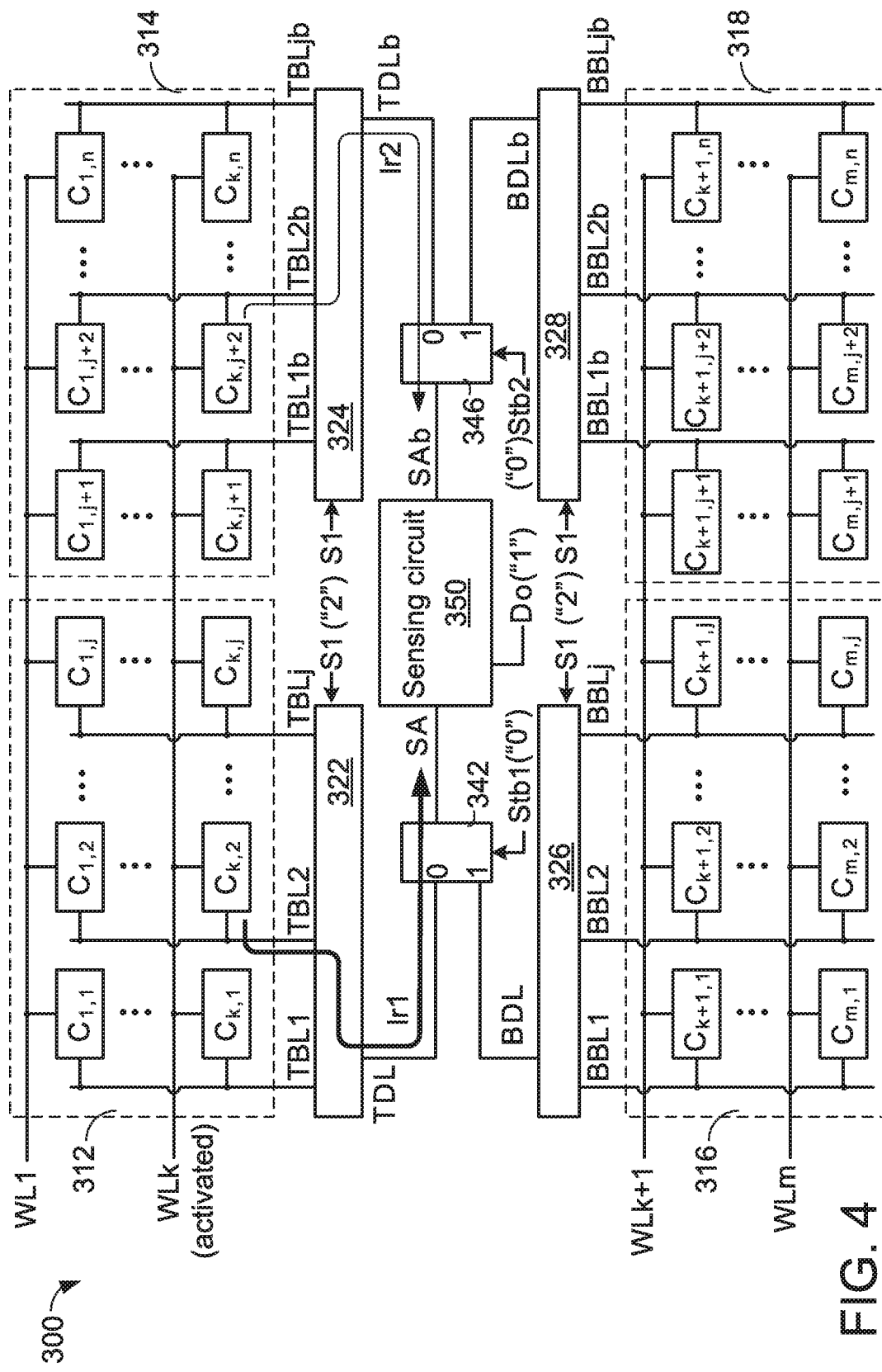
FIG. 4 is a schematic circuit diagram illustrating the non-volatile memory according to the first embodiment of the present invention during the read cycle.

FIG. 4 is a schematic circuit diagram illustrating the non-volatile memory according to the first embodiment of the present invention during the read cycle. For example, the selected differential cell to be read contains the main cell $C_{k,2}$ and the corresponding cell $C_{k,j+2}$.

During the read cycle, the word line WLk is activated, but the other word lines are inactivated. Moreover, the select signal S1 is "2", and the select signals Stb1 and Stb2 are "0". Consequently, the read current Ir1 generated by the main cell $C_{k,2}$ is transmitted from the top bit line TBL2 to the sensing circuit 350 through the first front selector 322, the top data line TDL, the first rear selector 342 and the sense line SA. Moreover, the read current Ir2 generated by the corresponding cell $C_{k,j+2}$ is transmitted from the inverted top bit line TBL2b to the sensing circuit 350 through the second front selector 324, the inverted top data line TDLb, the second rear selector 346 and the inverted sense line SAb.

According to the difference between the two read currents Ir1 and Ir2, the sensing circuit 350 generates the output signal Do. Moreover, the storage state of the selected differential cell is determined according to the output signal Do. For example, if the read current Ir1 flowing through the sense line SA is higher than the read current Ir2 flowing through the inverted sense line SAb, the output signal Do from the sensing circuit 350 has the logic value "1". Meanwhile, the selected differential cell is in the first storage state. Whereas, if the read current Ir1 flowing through the sense line SA is lower than the read current Ir2 flowing through the inverted sense line SAb, the output signal Do from the sensing circuit 350 has a logic value "0". Meanwhile, the selected differential cell is in the second storage state.

Consequently, during the read cycle, any differential cell of the non-volatile memory 300 is read and the storage state of the selected differential cell is determined.

After the erase action on the non-volatile memory 300 is completed, all of the cells $C_{1,1}$~$C_{m,n}$ are restored to the first storage state. Then, the sensing circuit 350 performs a verification action to confirm whether all of the cells $C_{1,1}$~$C_{m,n}$ are restored to the first state.

As mentioned above, the sensing circuit 350 has to receive the two read currents from the main cell and the corresponding cell in different storage states in order to achieve the accurate judgment. After the erase action on the non-volatile memory 300 is completed, all of the cells $C_{1,1}$~$C_{m,n}$ are in the first state. Under this circumstance, the sensing circuit 350 cannot judge the storage state of the selected differential cell.

For solving the above drawbacks, the non-volatile memory 300 needs to be further modified. The modified non-volatile memory can be subjected to the verification action.

Figure 5:
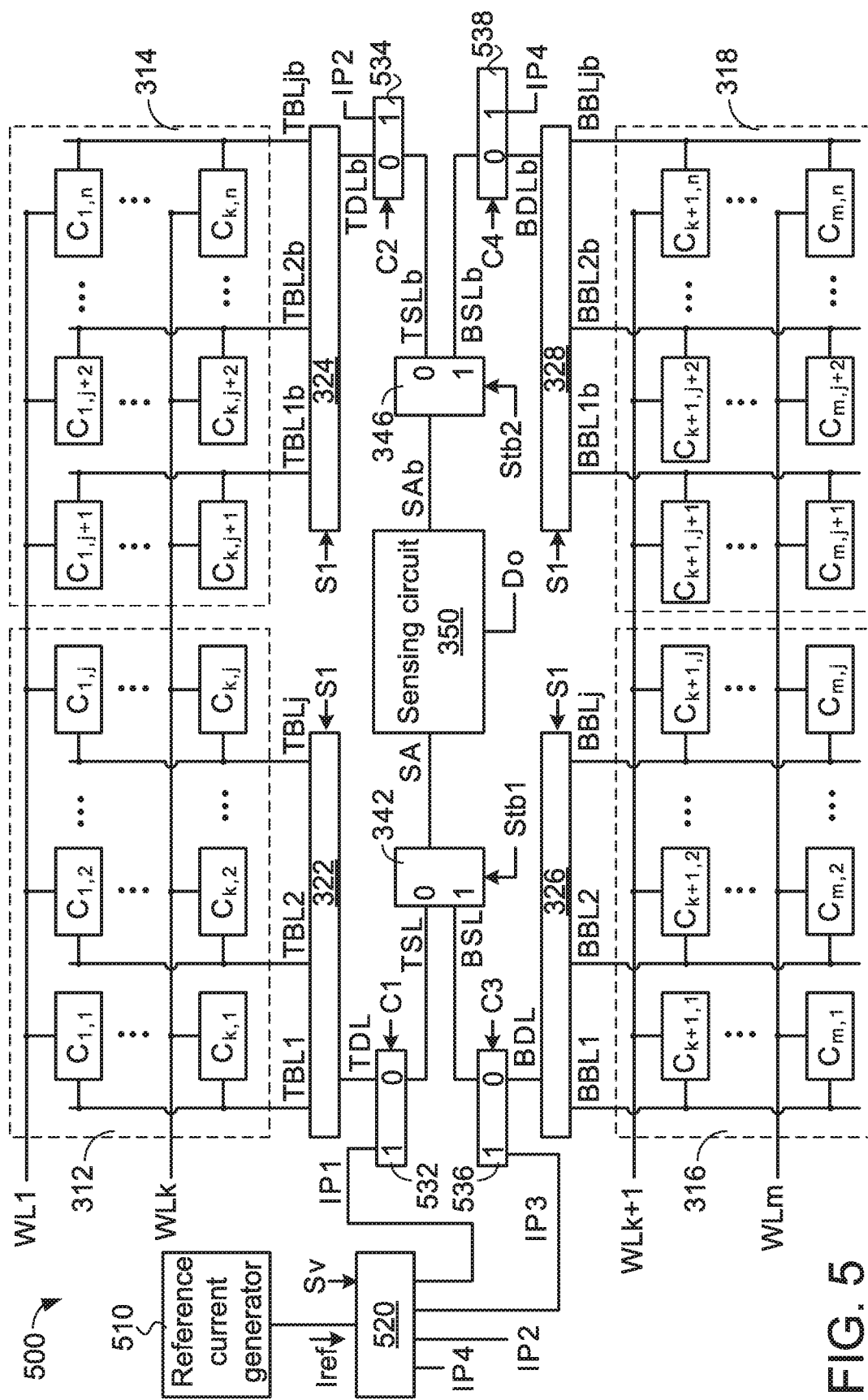
FIG. 5 is a schematic circuit diagram illustrating a non-volatile memory according to a second embodiment of the present invention.

FIG. 5 is a schematic circuit diagram illustrating a non-volatile memory according to a second embodiment of the present invention. In comparison with the non-volatile memory 300 of the first embodiment, the non-volatile memory 500 of this embodiment further comprises a reference current generator 510. Moreover, the selecting circuit further comprises a fifth front selector 520 and four medium selectors 532, 534, 536 and 538. For succinctness, only the functions of the additional components will be described as follows.

In this embodiment, the reference current generator 510 generates a reference current Iref. The input terminal of the fifth front selector 520 receives the reference current Iref. The output terminals of the fifth front selector 520 are connected with the first current path IP1, the second current path IP2, the third current path IP3 and the fourth current path IP4. According to a select signal Sv, the fifth front selector 520 transmits the reference current Iref to one of the first current path IP1, the second current path IP2, the third current path IP3 and the fourth current path IP4.

Each medium selector is arranged between the corresponding front selector and the corresponding rear selector. The two input terminals of the first medium selector 532 are connected with the top data line TDL and a first current path IP1. An output terminal of the first medium selector 532 is connected with a top select line TSL. According to a select signal C1, the reference Iref on the first current path IP1 can be selected by the first medium selector 532 to connect the top select line TSL. The two input terminals of the second medium selector 534 are connected with the inverted top data line TDLb and a second current path IP2. An output terminal of the second medium selector 534 is connected with an inverted top select line TSLb. According to a select signal C2, the reference Iref on the second current path IP2 can be selected by the second medium selector 534 to connect the inverted top select line TSLb. The two input terminals of the third medium selector 536 are connected with the bottom data line BDL and a third current path IP3. An output terminal of the third medium selector 536 is connected with a bottom select line BSL. According to a select signal C3, the reference Iref on the third current path IP3 can be selected by the third medium selector 536 to connect the bottom select line BSL. The two input terminals of the fourth medium selector 538 are connected with the inverted bottom data line BDLb and a fourth current path IP4. An output terminal of the fourth medium selector 538 is connected with an inverted bottom select line BSLb. According to a select signal C4, the reference Iref on the fourth current path IP4 can be selected by the fourth medium selector 538 to connect the inverted bottom select line BSLb.

The two input terminals of the first rear selector 342 are connected with the top select line TSL and the bottom select line BSL, respectively. The output terminal of the first rear selector 342 is connected with the sense line SA. According to a select signal Stb1, the first rear selector 342 connects one of the top select line TSL and the bottom select line BSL with the sense line SA. The two input terminals of the second rear selector 346 are connected with the inverted top select line TSLb and the inverted bottom select line BSLb, respectively. The output terminal of the second rear selector 346 is connected with an inverted sense line SAb. According to the select signal Stb2, the second rear selector 346 connects one of the inverted top select line TSLb and the inverted bottom select line BSLb with the inverted sense line SAb.

During the read cycle of the non-volatile memory 500, all of the four select signals C1~C4 are set as "0". Then, the read action as described in the first embodiment is performed to read the storage state of any differential cell of the non-volatile memory 500. The detailed process of the read action is not redundantly described herein. Hereinafter, a process of performing a verification action of the non-volatile memory 500 will be described.

During the process of performing the verification action of the non-volatile memory 500, two phases are employed to verify whether the main cell and the corresponding cell of the differential cell are in the first state. Hereinafter, the process of performing the verification action on the top differential cell and the bottom differential cell will be described.

Figure 6A:
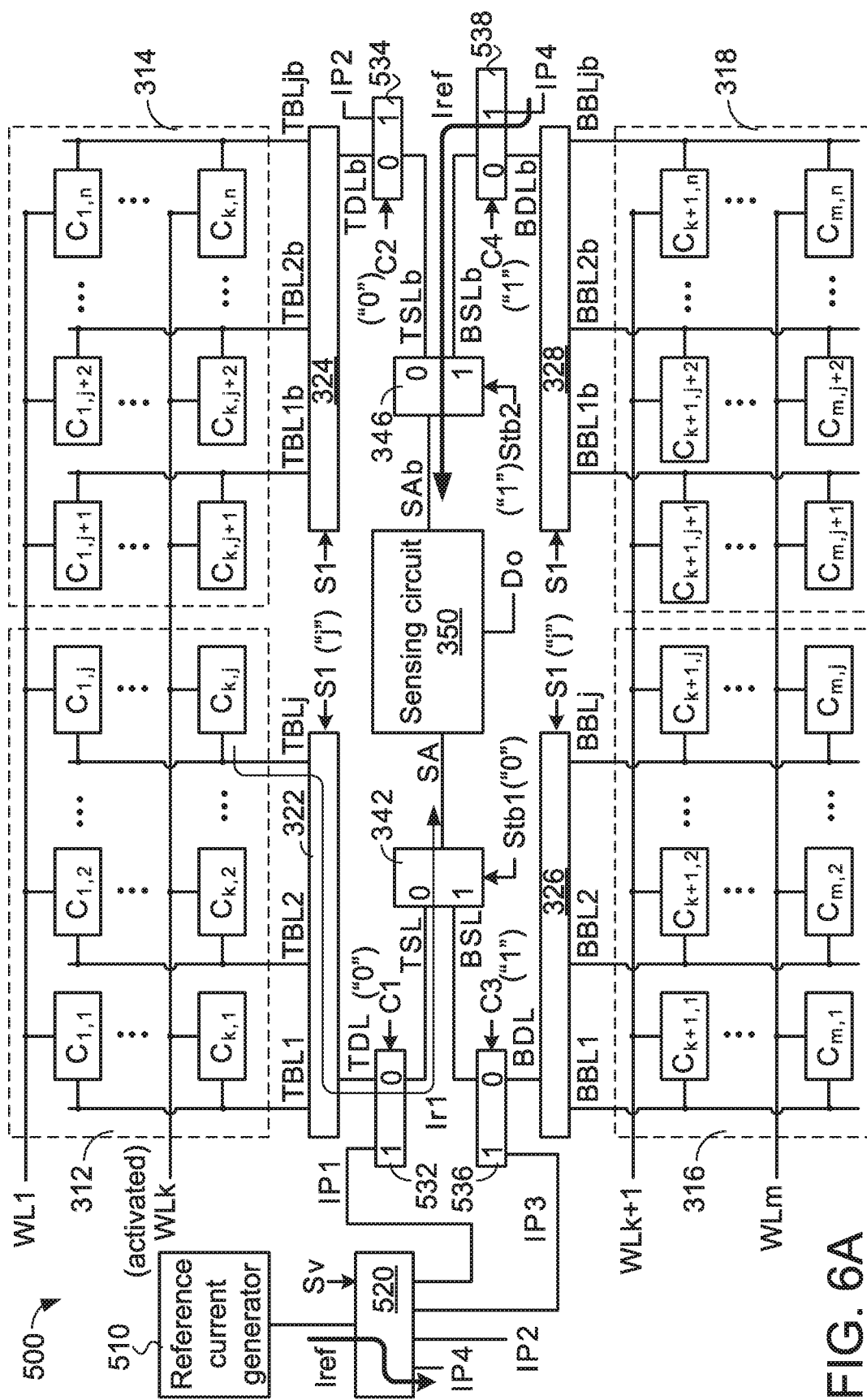
FIGS. 6A and 6B are schematic circuit diagrams illustrating the operations of the non-volatile memory according to the second embodiment of the present invention while a verification action is performed on a differential cell of the top main array and the top corresponding array.
Figure 6B:
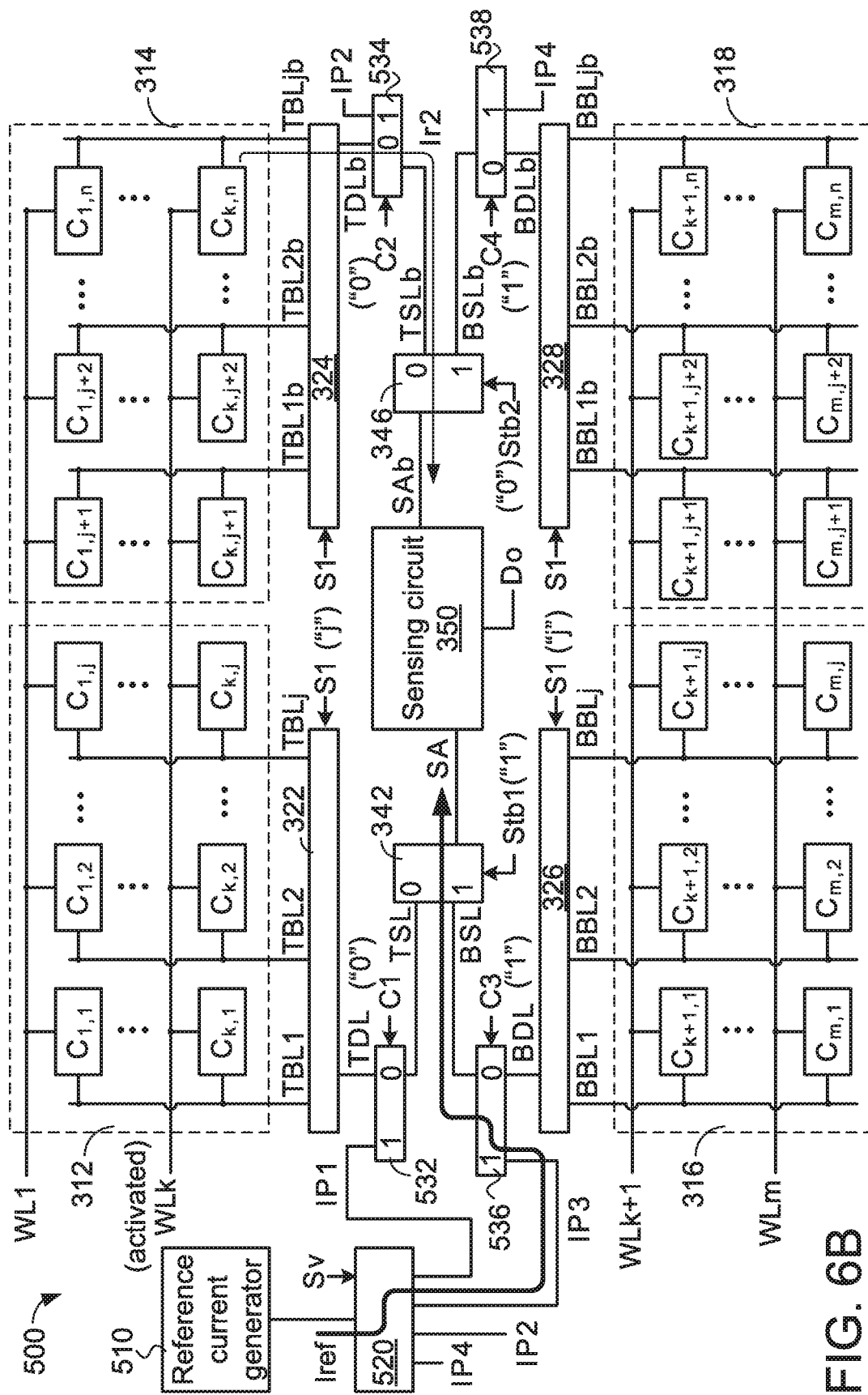

FIGS. 6A and 6B are schematic circuit diagrams illustrating the operations of the non-volatile memory according to the second embodiment of the present invention while a verification action is performed on a differential cell of the top main array and the top corresponding array. For example, the differential cell contains the main cell $C_{k,j}$ and the corresponding cell $C_{k,n}$.

Please refer to FIG. 6A. In a first phase of the verification action, the word line WLk is activated, but the other word lines are inactivated. Moreover, the select signal S1 is "j", the select signals C1 and C2 are "0", the select signals C3 and C4 are "1", the select signal Stb1 is "0", and the select signal Stb2 is "1". According to the select signal Sv, the fifth front selector 520 transmits the reference current Iref to the fourth current path IP4.

Consequently, the read current Ir1 generated by the main cell $C_{k,j}$ is transmitted from the top bit line TBLj to the sensing circuit 350 through the first front selector 322, the top data line TDL, the first medium selector 532, the top select line TSL, the first rear selector 342 and the sense line SA. The reference current Iref is transmitted to the sensing circuit 350 through the fifth front selector 520, the fourth current path IP4, the fourth medium selector 538, the inverted bottom select line BSLb, the second rear selector 346 and the inverted sense line SAb. According to the difference between the read current Ir1 and the reference current Iref, the sensing circuit 350 generates the output signal Do. Moreover, the storage state of the main cell $C_{k,j}$ in the selected differential cell is determined according to the output signal Do.

For example, the reference current Iref is higher than the read current of the cell in the first state. Please refer to FIG. 6A again. In the first phase of the verification action, the reference current Iref is higher than the read current Ir1 of the main cell $C_{k,j}$. Consequently, the sensing circuit 350 confirms that the main cell $C_{k,j}$ is in the first state. Whereas, if the reference current Iref is lower than the read current Ir1 of the main cell $C_{k,j}$, the sensing circuit 350 confirms that the main cell $C_{k,j}$ is not in the first state and the erase action fails.

Please refer to FIG. 6B. In a second phase of the verification action, the select signal Stb1 is changed to "1", and the select signal Stb2 is changed to "0". According to the select signal Sv, the fifth front selector 520 transmits the reference current Iref to the third current path IP3.

Consequently, the read current Ir2 generated by the corresponding cell $C_{k,n}$ is transmitted from the inverted top bit line TBLjb to the sensing circuit 350 through the second front selector 324, the inverted top data line TDLb, the second medium selector 534, the inverted top select line TSLb, the second rear selector 346 and the inverted sense line SAb. The reference current Iref is transmitted to the sensing circuit 350 through the fifth front selector 520, the third current path IP3, the third medium selector 536, the bottom select line BSL, the first rear selector 342 and the sense line SA. According to the difference between the read current Ir2 and the reference current Iref, the sensing circuit 350 generates the output signal Do. Moreover, the storage state of the corresponding cell $C_{k,n}$ in the selected differential cell is determined according to the output signal Do.

In the second phase of the verification action, the reference current Iref is higher than the read current Ir2 of the corresponding cell $C_{k,n}$. Consequently, the sensing circuit 350 confirms that the corresponding cell $C_{k,n}$ is in the first state.

Since both of the main cell $C_{k,j}$ and the corresponding cell $C_{k,n}$ of the differential cell are in the first state, the differential cell passes the verification action.

Figure 6C:
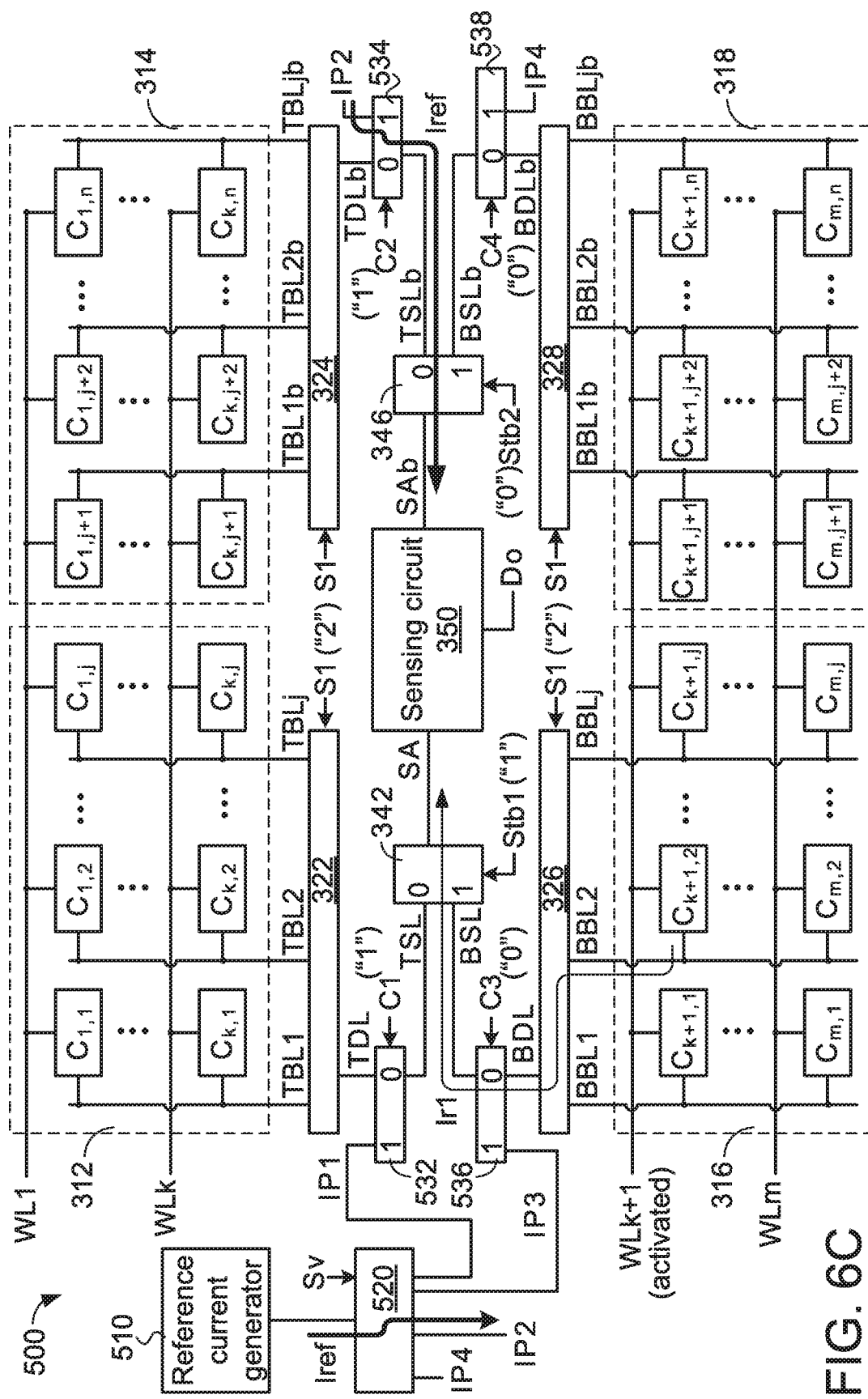
FIGS. 6C and 6D are schematic circuit diagrams illustrating the operations of the non-volatile memory according to the second embodiment of the present invention while a verification action is performed on a differential cell of the bottom main array and the bottom corresponding array.
Figure 6D:
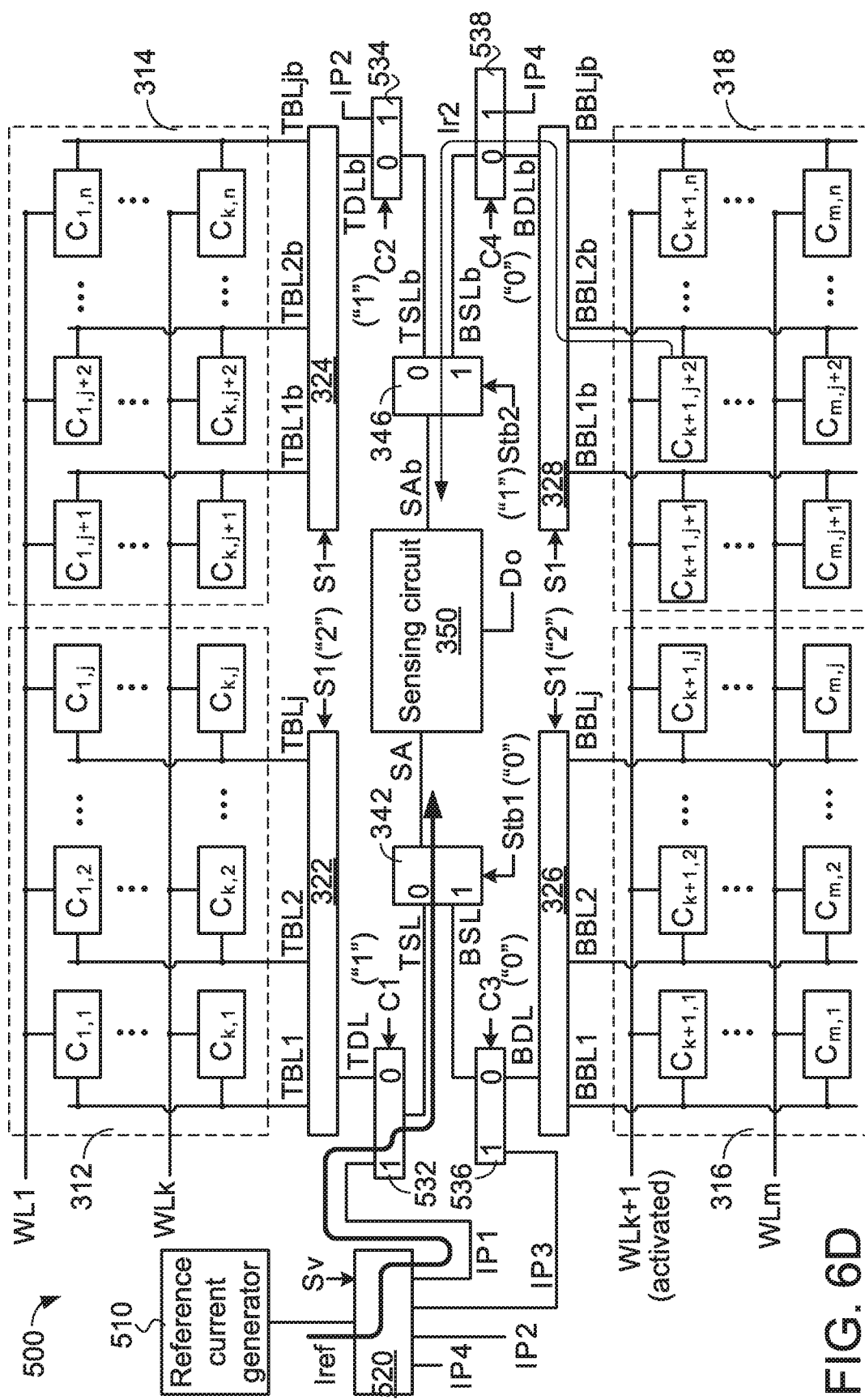

FIGS. 6C and 6D are schematic circuit diagrams illustrating the operations of the non-volatile memory according to the second embodiment of the present invention while a verification action is performed on a differential cell of the bottom main array and the bottom corresponding array. For example, the differential cell contains the main cell $C_{k+1,2}$ and the corresponding $C_{k+1,j+2}$.

Please refer to FIG. 6C. In a first phase of the verification action, the word line WLk+1 is activated, but the other word lines are inactivated. Moreover, the select signal S1 is "2", the select signals C1 and C2 are "1", the select signals C3 and C4 are "0", the select signal Stb1 is "1", and the select signal Stb2 is "0". According to the select signal Sv, the fifth front selector 520 transmits the reference current Iref to the second current path IP2.

Consequently, the read current Ir1 generated by the main cell $C_{k+1,2}$ is transmitted from the bottom bit line BBL2 to the sensing circuit 350 through the third front selector 326, the bottom data line BDL, the third medium selector 536, the bottom select line BSL, the first rear selector 342 and the sense line SA. The reference current Iref is transmitted to the sensing circuit 350 through the fifth front selector 520, the second current path IP2, the second medium selector 534, the inverted top select line TSLb, the second rear selector 346 and the inverted sense line SAb. According to the difference between the read current Ir1 and the reference current Iref, the sensing circuit 350 generates the output signal Do. Moreover, the storage state of the main cell $C_{k+1,2}$ in the selected differential cell is determined according to the output signal Do.

Please refer to FIG. 6C again. In the first phase of the verification action, the reference current Iref is higher than the read current Ir1 of the main cell $C_{k+1,2}$. Consequently, the sensing circuit 350 confirms that the main cell $C_{k+1,2}$ is in the first state.

Please refer to FIG. 6D. In a second phase of the verification action, the select signal Stb1 is changed to "0", and the select signal Stb2 is changed to "1". According to the select signal Sv, the fifth front selector 520 transmits the reference current Iref to the first current path IP1.

Consequently, the read current Ir2 generated by the corresponding cell $C_{k+1,j+2}$ is transmitted from the inverted bottom bit line BBL2b to the sensing circuit 350 through the fourth front selector 328, the inverted bottom data line BDLb, the fourth medium selector 538, the inverted bottom select line BSLb, the second rear selector 346 and the inverted sense line SAb. The reference current Iref is transmitted to the sensing circuit 350 through the fifth front selector 520, the first current path IP1, the first medium selector 532, the top select line TSL, the first rear selector 342 and the sense line SA. According to the difference between the read current Ir2 and the reference current Iref, the sensing circuit 350 generates the output signal Do. Moreover, the storage state of the corresponding cell $C_{k+1,j+2}$ in the selected differential cell is determined according to the output signal Do.

In the second phase of the verification action, the reference current Iref is higher than the read current Ir2 of the corresponding cell $C_{k+1,j+2}$. Consequently, the sensing circuit 350 confirms that the corresponding cell $C_{k+1,j+2}$ is in the first state.

Since both of the main cell $C_{k+1,2}$ and the corresponding $C_{k+1,j+2}$ of the differential cell are in the first state, the differential cell passes the verification action.

Figure 7:
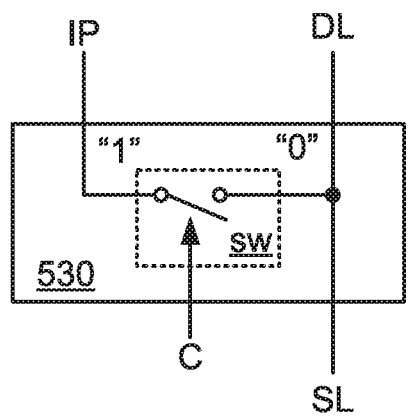
FIG. 7 is a schematic circuit diagram illustrating an example of a medium selector used in the non-volatile memory of the present invention.

FIG. 7 is a schematic circuit diagram illustrating an example of a medium selector used in the non-volatile memory of the present invention. The medium selector 530 may applied to the medium selector 532, 534, 536, 538 of the present invention. The medium selector 530 comprises a switch sw. A first input terminal "1" of the medium selector 530 is connected with the current path IP, a second input terminal "0" of the medium selector 530 is connected with the data line DL, and an output terminal of the medium selector 530 is connected with the select line SL.

In the medium selector 530, a first terminal of the switch sw is connected with the first input terminal "1" of the medium selector 530, a second terminal of the switch sw is connected with the second input terminal "0" of the medium selector 530 and the output terminal of the medium selector 530, and a control terminal of the switch sw receives the select signal C. If the select signal C is a logic value "0", the switch sw is in an open state and two terminals of the switch sw are not connected with each other. If the select signal C is a logic value "1", the switch sw is in a close state and two terminals of the switch sw are connected with each other.

It is noted that the structure of the medium selector 530 is not restricted. For example, the medium selector may be implemented by a current multiplexer. Two input terminals of the current multiplexer are connected with the current path IP and the data line DL, respectively. An output terminal of the current multiplexer is connected with the select line SL, and a select terminal of the current multiplexer receives the select signal C.

Figure 8A:
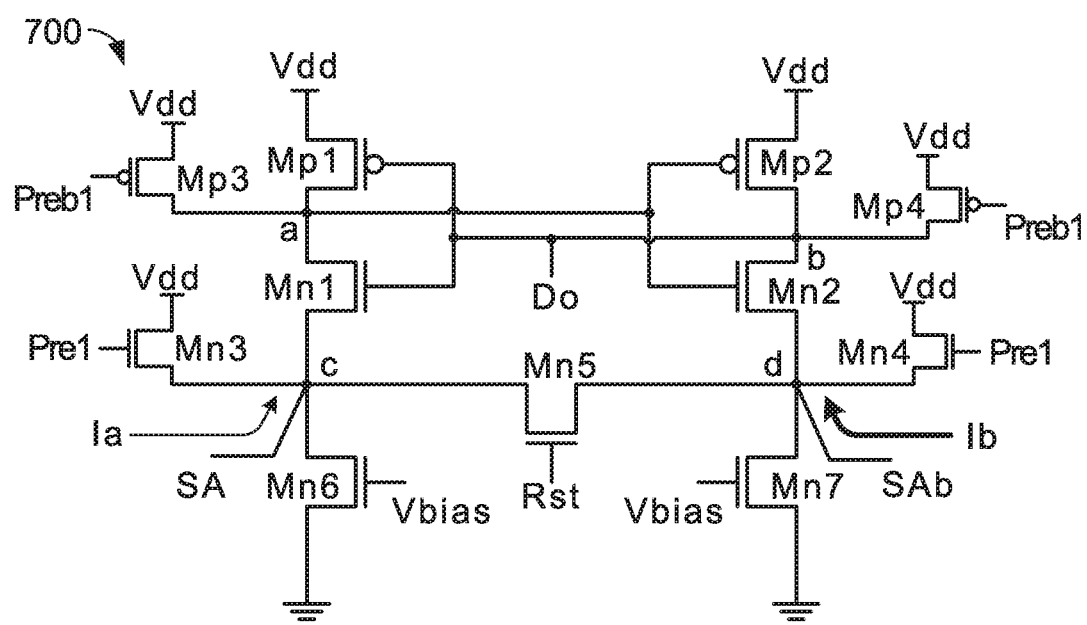
FIGS. 8A, 8B, 8C and 8D are schematic circuit diagrams illustrating four examples of the sensing circuit used in the non-volatile memory of the present invention.

FIG. 8A is a schematic circuit diagram illustrating a first example of a sensing circuit used in the non-volatile memory of the present invention. For example, the sensing circuit 700 is a current comparator. The sensing circuit 700 comprises transistors Mp1, Mp2, Mp3, Mp4, Mn1, Mn2, Mn3, Mn4, Mn5, Mn6 and Mn7.

The source terminal of the transistor Mp1 receives a power voltage Vdd. The gate terminal of the transistor Mp1 is connected with the node b. The drain terminal of the transistor Mp1 is connected with the node a. The source terminal of the transistor Mp2 receives the power voltage Vdd. The gate terminal of the transistor Mp2 is connected with the node a. The drain terminal of the transistor Mp2 is connected with the node b. The node b is the output terminal of the sensing circuit 700 for generating the output signal Do.

The source terminal of the transistor Mp3 receives the power voltage Vdd. The gate terminal of the transistor Mp3 receives an inverted pre-charge signal Preb1. The drain terminal of the transistor Mp3 is connected with the node a. The source terminal of the transistor Mp4 receives the power voltage Vdd. The gate terminal of the transistor Mp4 receives the inverted pre-charge signal Preb1. The drain terminal of the transistor Mp4 is connected with the node b.

The drain terminal of the transistor Mn1 is connected with the node a. The gate terminal of the transistor Mn1 is connected with the node b. The source terminal of the transistor Mn1 is connected with the node c. The drain terminal of the transistor Mn2 is connected with the node b. The gate terminal of the transistor Mn2 is connected with the node a. The source terminal of the transistor Mn2 is connected with the node d.

The drain terminal of the transistor Mn3 receives the power voltage Vdd. The gate terminal of the transistor Mn3 receives a pre-charge signal Pre1. The source terminal of the transistor Mn3 is connected with the node c. The drain terminal of the transistor Mn4 receives the power voltage Vdd. The gate terminal of the transistor Mn4 receives the pre-charge signal Pre1. The source terminal of the transistor Mn4 is connected with the node d.

The source terminal of the transistor Mn5 is connected with the node c. The drain terminal of the transistor Mn5 is connected with the node d. The gate terminal of the transistor Mn5 receives a reset signal Rst. Furthermore, the node c is connected with the sense line SA. The node d is connected with the inverted sense line SAb.

The drain terminal of the transistor Mn6 is connected with the node c. The gate terminal of the transistor Mn6 receives a bias voltage Vbias. The source terminal of the transistor Mn6 is connected with a ground terminal. The drain terminal of the transistor Mn7 is connected with the node d. The gate terminal of the transistor Mn7 receives the bias voltage Vbias. The source terminal of the transistor Mn7 is connected with the ground terminal.

Before the sensing operation of the sensing circuit 700 is performed, the reset signal Rst is activated shortly. Consequently, the node c and the node d are connected with each other and then separated from each other. Then, the pre-charge signal Pre1 and the inverted pre-charge signal Preb1 are activated shortly. Consequently, the transistors Mp3, Mp4, Mn3 and Mn4 are turned on. The voltages at the node a and the node b are charged to Vdd, and the voltages at the node c and the node d are charged to Vdd-Vthn, wherein Vthn is the threshold voltage of the n-type transistors Mn3 and Mn4. For example, Vthn is about 0.5V.

When the sense line SA and the inverted sense line Sab receive the currents Ia and Ib, respectively, the sensing circuit 700 starts the sensing action. Please refer to FIG. 8A again. If the current Ia is lower than the current Ib, the voltage drop speeds of the node d and the node b are larger than the voltage drop speeds of the node c and the node a. Since the transistor Mn1 is turned off and the transistor Mp1 is turned on, the voltage at the node a is maintained at Vdd. Moreover, since the transistor Mn2 is turned on and the transistor Mp2 is turned off, the voltage at the node b drops to 0V. That is, the output signal Do has a logic value "0".

Whereas, if the current Ia is higher than the current Ib, the output signal Do from the sensing circuit 700 has a logic value "1".

Figure 8B:
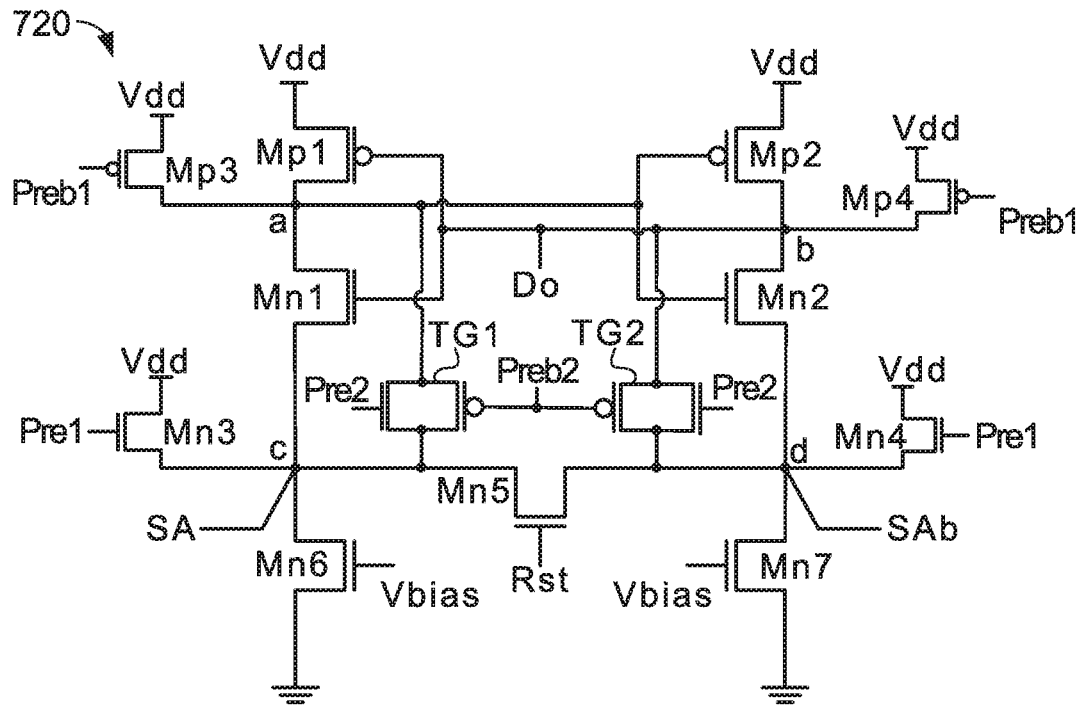

FIG. 8B is a schematic circuit diagram illustrating a second example of the sensing circuit used in the non-volatile memory of the present invention. In comparison with the sensing circuit 700, the sensing circuit 720 further comprises a transmission gate TG1 and a transmission gate TG2. The transmission gate TG1 includes one PMOS transistor and one NMOS transistor. The same, the transmission gate TG2 includes one PMOS transistor and one NMOS transistor.

The input terminal of the transmission gate TG1 is connected with the node a, the output terminal of the transmission gate TG1 is connected with the node c, the first control terminal of the transmission gate TG1 receives the pre-charge signal Pre2, and the second control terminal of the transmission gate TG1 receives the inverted pre-charge signal Preb2. The input terminal of the transmission gate TG2 is connected with the node b, the output terminal of the transmission gate TG2 is connected with the node d, the first control terminal of the transmission gate TG2 receives the pre-charge signal Pre2, and the second control terminal of the transmission gate TG2 receives the inverted pre-charge signal Preb2. In another embodiment, the pre-charge signal Pre1 and Pre2 can be the same while the pre-charge signal Preb1 and Preb2 can be the same.

While the pre-charge signal Pre1, the pre-charge signal Pre2, the inverted pre-charge signal Preb1 and the inverted pre-charge signal Preb2 in the sensing circuit 720 are activated shortly, the voltages at the node a, the node b, the node c and the node d are charged to Vdd. Consequently, the sensing speed of the sensing circuit 720 increases.

Figure 8C:
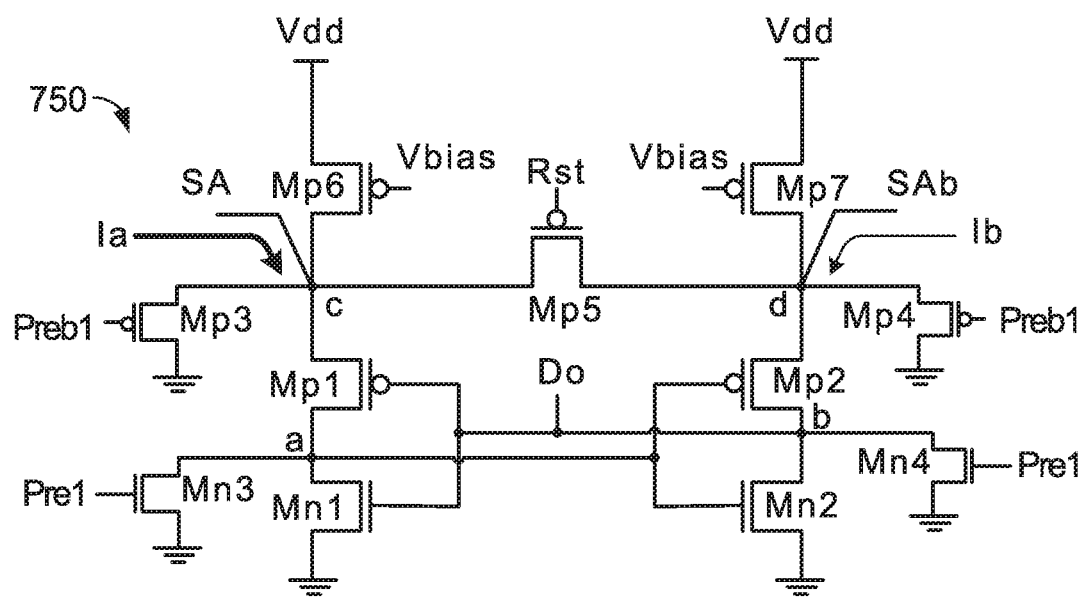

FIG. 8C is a schematic circuit diagram illustrating a third example of a sensing circuit used in the non-volatile memory of the present invention. For example, the sensing circuit 750 is a current comparator. The sensing circuit 750 comprises transistors Mp1, Mp2, Mp3, Mp4, Mp5, Mp6, Mp7, Mn1, Mn2, Mn3 and Mn4.

The source terminal of the transistor Mn1 is connected with a ground terminal. The gate terminal of the transistor Mn1 is connected with the node b. The drain terminal of the transistor Mn1 is connected with the node a. The source terminal of the transistor Mn2 is connected with the ground terminal. The gate terminal of the transistor Mn2 is connected with the node a. The drain terminal of the transistor Mn2 is connected with the node b. The node b is the output terminal of the sensing circuit 750 for generating the output signal Do.

The source terminal of the transistor Mn3 is connected with the ground terminal. The gate terminal of the transistor Mn3 receives a pre-charge signal Pre1. The drain terminal of the transistor Mn3 is connected with the node a. The source terminal of the transistor Mn4 is connected with the ground terminal. The gate terminal of the transistor Mn4 receives the pre-charge signal Pre1. The drain terminal of the transistor Mn4 is connected with the node b.

The drain terminal of the transistor Mp1 is connected with the node a. The gate terminal of the transistor Mp1 is connected with the node b. The source terminal of the transistor Mp1 is connected with the node c. The drain terminal of the transistor Mp2 is connected with the node b. The gate terminal of the transistor Mp2 is connected with the node a. The source terminal of the transistor Mp2 is connected with the node d.

The drain terminal of the transistor Mp3 is connected with the ground terminal. The gate terminal of the transistor Mp3 receives an inverted pre-charge signal Preb1. The source terminal of the transistor Mp3 is connected with the node c. The drain terminal of the transistor Mp4 is connected with the ground terminal. The gate terminal of the transistor Mp4 receives the inverted pre-charge signal Preb1. The source terminal of the transistor Mp4 is connected with the node d.

The source terminal of the transistor Mp5 is connected with the node c. The drain terminal of the transistor Mp5 is connected with the node d. The gate terminal of the transistor Mp5 receives a reset signal Rst. Furthermore, the node c is connected with the sense line SA. The node d is connected with the inverted sense line SAb.

The drain terminal of the transistor Mp6 is connected with the node c. The gate terminal of the transistor Mp6 receives a bias voltage Vbias. The source terminal of the transistor Mn6 receives a power voltage Vdd. The drain terminal of the transistor Mp7 is connected with the node d. The gate terminal of the transistor Mp7 receives the bias voltage Vbias. The source terminal of the transistor Mp7 received the power voltage Vdd.

Before the sensing operation of the sensing circuit 750 is performed, the reset signal Rst is activated shortly. Consequently, the node c and the node d are connected with each other and then separated from each other. Then, the pre-charge signal Pre1 and the inverted pre-charge signal Preb1 are activated shortly. Consequently, the transistors Mp3, Mp4, Mn3 and Mn4 are turned on. The voltages at the node a and the node b are discharged to ground voltage, and the voltages at the node c and the node d are discharged to Vthp, wherein Vthp is the threshold voltage of the p-type transistors Mp3 and Mp4. For example, Vthp is about 0.5V.

When the sense line SA and the inverted sense line Sab receive the currents Ia and Ib, respectively, the sensing circuit 750 starts the sensing action. Please refer to FIG. 8C again. If the current Ia is higher than the current Ib, the voltage increasing speeds of the node c and the node a are larger than the voltage increasing speeds of the node d and the node b. Since the transistor Mn1 is turned off and the transistor Mp1 is turned on, the voltage at the node a is charged to a voltage level of Vdd. Moreover, since the transistor Mn2 is turned on and the transistor Mp2 is turned off, the voltage at the node b drops to 0V. That is, the output signal Do has a logic value "0".

Whereas, if the current Ia is lower than the current Ib, the output signal Do from the sensing circuit 750 has a logic value "1".

Figure 8D:
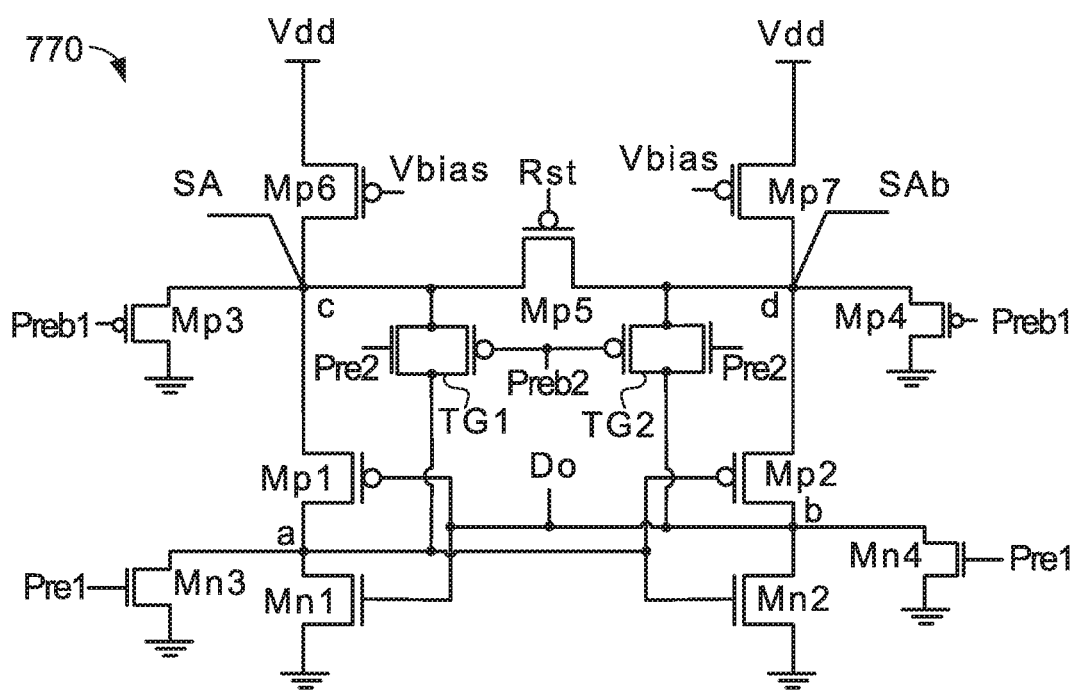

FIG. 8D is a schematic circuit diagram illustrating a fourth example of the sensing circuit used in the non-volatile memory of the present invention. In comparison with the sensing circuit 750, the sensing circuit 770 further comprises a transmission gate TG1 and a transmission gate TG2. The transmission gate TG1 includes one PMOS transistor and one NMOS transistor. The same, the transmission gate TG2 includes one PMOS transistor and one NMOS transistor.

The input terminal of the transmission gate TG1 is connected with the node a, the output terminal of the transmission gate TG1 is connected with the node c, the first control terminal of the transmission gate TG1 receives the pre-charge signal Pre2, and the second control terminal of the transmission gate TG1 receives the inverted pre-charge signal Preb2. The input terminal of the transmission gate TG2 is connected with the node b, the output terminal of the transmission gate TG2 is connected with the node d, the first control terminal of the transmission gate TG2 receives the pre-charge signal Pre2, and the second control terminal of the transmission gate TG2 receives the inverted pre-charge signal Preb2. In another embodiment, the pre-charge signal Pre1 and Pre2 can be the same while the pre-charge signal Preb1 and Preb2 can be the same.

While the pre-charge signal Pre1, the pre-charge signal Pre2, the inverted pre-charge signal Preb1 and the inverted pre-charge signal Preb2 in the sensing circuit 770 are activated shortly, the voltages at the node a, the node b, the node c and the node d are discharged to ground voltage. Consequently, the sensing speed of the sensing circuit 770 increases.

From the above descriptions, the present invention provides a non-volatile memory having a memory array with differential cells. While the verification action of the non-volatile memory of the second embodiment is performed, each of the reference current Iref, the read current Ir1 and the read current Ir2 flows through one front selector, one medium selector and one rear selector. In other words, all of the reference current Iref, the read current Ir1 and the read current Ir2 flow the same load. Consequently, the judging accuracy of the sensing circuit 350 is increased.

Moreover, the memory array is divided into four sub-arrays 312, 314, 316 and 318. These sub-arrays are located at the top side and the bottom side of the sensing circuit 350. Consequently, the lengths of all bit lines are effectively shortened, the read speed of the non-volatile memory 500 is kept fast, and the power consumption is reduced. It is noted that numerous modifications and alterations may be made while retaining the teachings of the invention. For example, in another embodiment, the four sub-arrays are located at the right side and the left side of the sensing circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
   a memory array comprising a top main array, a top corresponding array, a bottom main array and a bottom corresponding array, wherein the top main array comprises j top bit lines, the top corresponding array comprises j inverted top bit lines, the bottom main array comprises j bottom bit lines, and the bottom corresponding array comprises j inverted bottom bit lines;
   a selecting circuit comprising a first front selector, a second front selector, a third front selector, a fourth front selector, a fifth front selector, a first medium selector, a second medium selector, a third medium selector, a fourth medium selector, a first rear selector and a second rear selector;
   a reference current generator connected with the fifth front selector, wherein the reference current generator generates a reference current, and the reference current is transmitted from the reference current generator to one of a first current path, a second current path, a third current path and a fourth current path through the fifth front selector; and
   a sensing circuit connected with a sense line and an inverted sense line,
   wherein the first front selector is connected with the j top bit lines, and one of the j top bit lines is connected with a top data line through the first front selector, wherein the second front selector is connected with the j inverted top bit lines, and one of the j inverted top bit lines is connected with an inverted top data line through the second front selector, wherein the third front selector is connected with the j bottom bit lines, and one of the j bottom bit lines is connected with a bottom data line through the third front selector, wherein the fourth front selector is connected with the j inverted bottom bit lines, and one of the j inverted bottom bit lines is connected with an inverted bottom data line through the fourth front selector,
   wherein two input terminals of the first medium selector are respectively connected with the top data line and the first current path, and an output terminal of the first medium selector is connected with a top select line, wherein two input terminals of the second medium selector are respectively connected with the inverted top data line and the second current path, and an output terminal of the second medium selector is connected with an inverted top select line, wherein two input terminals of the third medium selector are respectively connected with the bottom data line and the third current path, and an output terminal of the third medium selector is connected with a bottom select line, wherein two input terminals of the fourth medium selector are respectively connected with the inverted bottom data line and the fourth current path, and an output terminal of the fourth medium selector is connected with an inverted bottom select line,
   wherein the first rear selector is connected with the top select line and the bottom select line, and one of the top select line and the bottom select line is connected with the sense line through the first rear selector, wherein the second rear selector is connected with the inverted top select line and the inverted bottom select line, and one of the inverted top select line and the inverted bottom select line is connected with the inverted sense line through the second rear selector.

2. The non-volatile memory as claimed in claim 1, wherein a first main cell of the top main array and a first corresponding cell of the top corresponding array are collaboratively formed as a first differential cell, wherein during a read cycle, a first read current generated by the first main cell is transmitted to the sensing circuit through the first front selector, the top data line, the first medium selector, the top select line, the first rear selector and the sense line, and a second read current generated by the first corresponding cell is transmitted to the sensing circuit through the second front selector, the inverted top data line, the second medium selector, the inverted top select line, the second rear selector and the inverted sense line.

3. The non-volatile memory as claimed in claim 1, wherein a second main cell of the bottom main array and a second corresponding cell of the bottom corresponding array are collaboratively formed as a second differential cell, wherein during a read cycle, a third read current generated by the second main cell is transmitted to the sensing circuit through the third front selector, the bottom data line, the third medium selector, the bottom select line, the first rear selector and the sense line, and a fourth read current generated by the second corresponding cell is transmitted to the sensing circuit through the fourth front selector, the inverted bottom data line, the fourth medium selector, the inverted bottom select line, the second rear selector and the inverted sense line.

4. The non-volatile memory as claimed in claim 1, wherein a third main cell of the top main array and a third corresponding cell of the top corresponding array are collaboratively formed as a third differential cell, wherein during a first phase of a verification action, a fifth read current generated by the third main cell is transmitted to the sensing circuit through the first front selector, the top data line, the first medium selector, the top select line, the first rear selector and the sense line, and the reference current is transmitted to the sensing circuit through the fifth front selector, the fourth current path, the fourth medium selector, the inverted bottom select line, the second rear selector and the inverted sense line.

5. The non-volatile memory as claimed in claim 4, wherein the fourth medium selector comprises a switch having a first terminal connected with the fourth current path and a second terminal connected with the inverted bottom select line and the inverted bottom data line, and wherein the switch is in a close state and the first terminal and the second terminal of the switch are connected with each other.

6. The non-volatile memory as claimed in claim 4, wherein during a second phase of the verification action, a sixth read current generated by the third corresponding cell is transmitted to the sensing circuit through the second front selector, the inverted top data line, the second medium selector, the inverted top select line, the second rear selector and the inverted sense line, and the reference current is transmitted to the sensing circuit through the fifth front selector, the third current path, the third medium selector, the bottom select line, the first rear selector and the sense line.

7. The non-volatile memory as claimed in claim 6, wherein the third medium selector comprises a switch having a first terminal connected with the third current path and a second terminal connected with the bottom select line and the bottom data line, and wherein the switch is in a close state and the first terminal and the second terminal of the switch are connected with each other.

8. The non-volatile memory as claimed in claim 1, wherein a fourth main cell of the bottom main array and a fourth corresponding cell of the bottom corresponding array are collaboratively formed as a fourth differential cell, wherein during a first phase of a verification action, a seventh read current generated by the fourth main cell is transmitted to the sensing circuit through the third front selector, the bottom data line, the third medium selector, the bottom select line, the first rear selector and the sense line, and the reference current is transmitted to the sensing circuit through the fifth front selector, the second current path, the second medium selector, the inverted top select line, the second rear selector and the inverted sense line.

9. The non-volatile memory as claimed in claim 8, wherein the second medium selector comprises a switch having a first terminal connected with the second current path and a second terminal connected with the inverted top select line and the inverted top data line, and wherein the switch is in a close state and the first terminal and the second terminal of the switch are connected with each other.

10. The non-volatile memory as claimed in claim 8, wherein during a second phase of the verification action, an eighth read current generated by the fourth corresponding cell is transmitted to the sensing circuit through the fourth front selector, the inverted bottom data line, the fourth medium selector, the inverted bottom select line, the second rear selector and the inverted sense line, and the reference current is transmitted to the sensing circuit through the fifth front selector, the first current path, the first medium selector, the top select line, the first rear selector and the sense line.

11. The non-volatile memory as claimed in claim 10, wherein the first medium selector comprises a switch having a first terminal connected with the first current path and a second terminal connected with the top select line and the top data line, and wherein the switch is in a close state and the first terminal and the second terminal of the switch are connected with each other.

12. The non-volatile memory as claimed in claim 1, wherein the sensing circuit comprises:
a first p-type transistor, wherein a source terminal of the first p-type transistor receives a power voltage, a drain terminal of the first p-type transistor is connected with a first node, and a gate terminal of the first p-type transistor is connected with a second node;
a second p-type transistor, wherein a source terminal of the second p-type transistor receives the power voltage, a drain terminal of the second p-type transistor is connected with the second node, and a gate terminal of the second p-type transistor is connected with the first node;
a third p-type transistor, wherein a source terminal of the third p-type transistor receives the power voltage, a drain terminal of the third p-type transistor is connected with the first node, and a gate terminal of the third p-type transistor receives a first inverted pre-charge signal;
a fourth p-type transistor, wherein a source terminal of the fourth p-type transistor receives the power voltage, a drain terminal of the fourth p-type transistor is connected with the second node, and a gate terminal of the fourth p-type transistor receives the first inverted pre-charge signal;
a first n-type transistor, wherein a drain terminal of the first n-type transistor is connected with the first node, a source terminal of the first n-type transistor is connected with a third node, a gate terminal of the first n-type transistor is connected with the second node, and the third node is connected with the sense line;
a second n-type transistor, wherein a drain terminal of the second n-type transistor is connected with the second node, a source terminal of the second n-type transistor is connected with a fourth node, a gate terminal of the second n-type transistor is connected with the first node, and the fourth node is connected with the inverted sense line;
a third n-type transistor, wherein a drain terminal of the third n-type transistor receives the power voltage, a source terminal of the third n-type transistor is connected with the third node, and a gate terminal of the third n-type transistor receives a first pre-charge signal;
a fourth n-type transistor, wherein a drain terminal of the fourth n-type transistor receives the power voltage, a source terminal of the fourth n-type transistor is connected with the fourth node, and a gate terminal of the fourth n-type transistor receives the first pre-charge signal; and
a fifth n-type transistor, wherein a drain terminal of the fifth n-type transistor is connected with the fourth node, a source terminal of the fifth n-type transistor is connected with the third node, and a gate terminal of the fifth n-type transistor receives a reset signal.

13. The non-volatile memory as claimed in claim 12, wherein the sensing circuit further comprises:
a sixth n-type transistor, wherein a drain terminal of the sixth n-type transistor is connected with the third node, a source terminal of the sixth n-type transistor is connected with a ground terminal, and a gate terminal of the sixth n-type transistor receives a bias voltage; and a seventh n-type transistor, wherein a drain terminal of the seventh n-type transistor is connected with the fourth node, a source terminal of the seventh n-type transistor is connected with the ground terminal, and a gate terminal of the seventh n-type transistor receives the bias voltage.

14. The non-volatile memory as claimed in claim 12, wherein the sensing circuit further comprises:
   a first transmission gate, wherein an input terminal of the first transmission gate is connected with the first node, an output terminal of the first transmission gate is connected with the third node, a first control terminal of the first transmission gate receives a second pre-charge signal, and a second control terminal of the first transmission gate receives a second inverted pre-charge signal; and
   a second transmission gate, wherein an input terminal of the second transmission gate is connected with the second node, an output terminal of the second transmission gate is connected with the fourth node, a first control terminal of the second transmission gate receives the second pre-charge signal, and a second control terminal of the second transmission gate receives the second inverted pre-charge signal.

15. The non-volatile memory as claimed in claim 14, wherein the sensing circuit further comprises:
   a sixth n-type transistor, wherein a drain terminal of the sixth n-type transistor is connected with the third node, a source terminal of the sixth n-type transistor is connected with a ground terminal, and a gate terminal of the sixth n-type transistor receives a bias voltage; and
   a seventh n-type transistor, wherein a drain terminal of the seventh n-type transistor is connected with the fourth node, a source terminal of the seventh n-type transistor is connected with the ground terminal, and a gate terminal of the seventh n-type transistor receives the bias voltage.

16. The non-volatile memory as claimed in claim 1, wherein the sensing circuit comprises:
   a first n-type transistor, wherein a source terminal of the first n-type transistor is connected with a ground terminal, a drain terminal of the first n-type transistor is connected with a first node, and a gate terminal of the first n-type transistor is connected with a second node;
   a second n-type transistor, wherein a source terminal of the second n-type transistor is connected with the ground terminal, a drain terminal of the second n-type transistor is connected with the second node, and a gate terminal of the second n-type transistor is connected with the first node;
   a third n-type transistor, wherein a source terminal of the third n-type transistor is connected with the ground terminal, a drain terminal of the third n-type transistor is connected with the first node, and a gate terminal of the third n-type transistor receives a first pre-charge signal;
   a fourth n-type transistor, wherein a source terminal of the fourth n-type transistor is connected with the ground terminal, a drain terminal of the fourth n-type transistor is connected with the second node, and a gate terminal of the fourth n-type transistor receives the first pre-charge signal;
   a first p-type transistor, wherein a drain terminal of the first p-type transistor is connected with the first node, a source terminal of the first p-type transistor is connected with a third node, a gate terminal of the first p-type transistor is connected with the second node, and the third node is connected with the sense line;
   a second p-type transistor, wherein a drain terminal of the second p-type transistor is connected with the second node, a source terminal of the second p-type transistor is connected with a fourth node, a gate terminal of the second p-type transistor is connected with the first node, and the fourth node is connected with the inverted sense line;
   a third p-type transistor, wherein a drain terminal of the third p-type transistor is connected with the ground terminal, a source terminal of the third p-type transistor is connected with the third node, and a gate terminal of the third p-type transistor receives a first inverted pre-charge signal;
   a fourth p-type transistor, wherein a drain terminal of the fourth p-type transistor is connected with the ground terminal, a source terminal of the fourth p-type transistor is connected with the fourth node, and a gate terminal of the fourth p-type transistor receives the first inverted pre-charge signal; and
   a fifth p-type transistor, wherein a drain terminal of the fifth p-type transistor is connected with the fourth node, a source terminal of the fifth p-type transistor is connected with the third node, and a gate terminal of the fifth p-type transistor receives a reset signal.

17. The non-volatile memory as claimed in claim 16, wherein the sensing circuit further comprises:
   a sixth p-type transistor, wherein a drain terminal of the sixth p-type transistor is connected with the third node, a source terminal of the sixth p-type transistor receives a power voltage, and a gate terminal of the sixth p-type transistor receives a bias voltage; and
   a seventh p-type transistor, wherein a drain terminal of the seventh p-type transistor is connected with the fourth node, a source terminal of the seventh p-type transistor receives the power voltage, and a gate terminal of the seventh p-type transistor receives the bias voltage.

18. The non-volatile memory as claimed in claim 16, wherein the sensing circuit further comprises:
   a first transmission gate, wherein an input terminal of the first transmission gate is connected with the first node, an output terminal of the first transmission gate is connected with the third node, a first control terminal of the first transmission gate receives a second pre-charge signal, and a second control terminal of the first transmission gate receives a second inverted pre-charge signal; and
   a second transmission gate, wherein an input terminal of the second transmission gate is connected with the second node, an output terminal of the second transmission gate is connected with the fourth node, a first control terminal of the second transmission gate receives the second pre-charge signal, and a second control terminal of the second transmission gate receives the second inverted pre-charge signal.

19. The non-volatile memory as claimed in claim 18, wherein the sensing circuit further comprises:
   a sixth p-type transistor, wherein a drain terminal of the sixth p-type transistor is connected with the third node, a source terminal of the sixth p-type transistor receives a power voltage, and a gate terminal of the sixth p-type transistor receives a bias voltage; and
   a seventh p-type transistor, wherein a drain terminal of the seventh p-type transistor is connected with the fourth node, a source terminal of the seventh p-type transistor receives the power voltage, and a gate terminal of the seventh p-type transistor receives the bias voltage.

* * * * *